(12) United States Patent
Krieg et al.

(10) Patent No.: US 6,925,413 B2
(45) Date of Patent: Aug. 2, 2005

(54) METHOD AND SYSTEM FOR DETECTING A SPATIAL MOVEMENT STATE OF MOVING OBJECTS

(75) Inventors: Dietmar Krieg, Unterensingen (DE); Reinhard Neul, Stuttgart (DE); Dorothea Papathanassiou, Reutlingen (DE); Roland Mueller-Fiedler, Leonberg (DE); Michael Knauss, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/320,278

(22) Filed: Dec. 16, 2002

(65) Prior Publication Data

US 2003/0163282 A1 Aug. 28, 2003

(30) Foreign Application Priority Data

Dec. 14, 2001 (DE) .......................... 101 61 631
Oct. 29, 2002 (DE) .......................... 102 50 321

(51) Int. Cl.$^7$ .......................... G01C 17/00; G01C 19/00
(52) U.S. Cl. .......................... 702/152
(58) Field of Search .......................... 702/150, 151, 702/152; 701/207, 213, 220, 221, 36, 38, 34

(56) References Cited

U.S. PATENT DOCUMENTS

| | | | | |
|---|---|---|---|---|
| 4,125,017 A | * | 11/1978 | Dhuyvetter et al. | ...... 73/178 R |
| 4,179,818 A | * | 12/1979 | Craig | .......................... 33/321 |
| 4,280,188 A | * | 7/1981 | Weinstein et al. | .......... 702/141 |
| 4,914,598 A | * | 4/1990 | Krogmann et al. | ........... 701/11 |
| 5,332,180 A | * | 7/1994 | Peterson et al. | ............... 246/3 |
| 5,363,700 A | * | 11/1994 | Joly et al. | ................ 73/504.18 |
| 5,479,161 A | * | 12/1995 | Keyes et al. | ........... 340/870.04 |
| 5,902,351 A | * | 5/1999 | Streit et al. | .................. 701/220 |
| 6,023,664 A | * | 2/2000 | Bennet | ........................ 702/141 |
| 6,332,103 B1 | * | 12/2001 | Steenson et al. | ................ 701/1 |
| 6,427,102 B1 | * | 7/2002 | Ding | ........................... 701/34 |
| 6,535,800 B2 | * | 3/2003 | Wallner | ......................... 701/1 |
| 2001/0032046 A1 | * | 10/2001 | Nada | ........................... 701/82 |
| 2002/0019719 A1 | * | 2/2002 | Kueblbeck et al. | .......... 702/147 |
| 2002/0075140 A1 | * | 6/2002 | Yeh et al. | .................... 340/438 |

FOREIGN PATENT DOCUMENTS

| | | |
|---|---|---|
| DE | 36 34 023 | 4/1988 |
| DE | 195 00 800 | 12/1995 |
| DE | 195 28 961 | 2/1997 |
| DE | 197 26 006 | 9/1998 |
| DE | 197 19 780 | 11/1998 |
| DE | 199 62 687 | 7/2001 |
| DE | 100 19 417 | 10/2001 |
| WO | WO 00/71393 | 11/2000 |

* cited by examiner

*Primary Examiner*—John Barlow
*Assistant Examiner*—Demetrius R. Pretlow
(74) *Attorney, Agent, or Firm*—Kenyon & Kenyon

(57) ABSTRACT

A method and a system for detecting the spatial movement state of moving objects, e.g., vehicles. Due to a, for example, non-cartesian arrangement of four rotational rate sensors and/or acceleration sensors, it is also possible to obtain a redundant signal in addition to the desired useful signal indicating the spatial movement state, e.g., the rotational movement and/or acceleration in space; if this redundant signal is large enough in comparison with the rotational rate actually applied, it may be used for detection of the size of the error and the defective sensor. The four sensors are mounted, for example, on a sensor platform forming a three-sided truncated pyramid so that all possible three-way combinations of sensors are mutually linearly independent. The accuracy about the vertical axis is defined by the angle of inclination of the side faces of the truncated pyramid.

27 Claims, 7 Drawing Sheets

METHOD AND SYSTEM FOR DETECTING A SPATIAL MOVEMENT STATE OF MOVING OBJECTS

FIELD OF THE INVENTION

The present invention relates to a method and a system for detecting a spatial movement state of moving objects, e.g., vehicles.

BACKGROUND INFORMATION

Previous automotive systems (e.g., ESP: electronic stabilizing program), restraint systems, and navigation systems are limited to the detection of planar movements of the vehicle and involve one-dimensional or two-dimensional measurement tasks. With advances in automotive engineering, there is a demand for detecting the spatial state of driving or motion. A variety of additional information may be made available through central detection of the spatial movement state. This information includes the inclination of the vehicle, which makes it possible to regulate the lighting, the displacement of the shift point of automatic operation on an inclination, etc., detection of a rollover and thus a more targeted deployment of airbags, recognition of steep curves, which may be used to improve the ESP algorithm, etc.

In the case of safety-relevant automated systems such as airbag systems and ESP, special emphasis is placed on the availability and correctness of the signals. Therefore, redundancy concepts are required for such systems if the additional information is used in the systems.

As mentioned above, detection of the planar driving state by acceleration sensors and rotational rate sensors is conventional. Such sensor systems for detection of the planar movement state have already been produced by the applicant for a long time. One of these systems detects the longitudinal and transverse acceleration of the vehicle as well as rotation about a vertical axis and calculates from this the planar movement state of the vehicle in a local vehicle estimator.

Other systems detect only planar movement states. Since vehicles in general and motor vehicles often execute spatial movements in reality, the above-mentioned conventional detection systems always measure only the projection of the spatial movement onto a constantly changing plane which represents the vehicle base area. Interpretation of these measurement results may result in errors in determination of the driving state. These errors are small in normal driving states but in various driving states such as driving on a steep curve, driving on a steep inclination, rollover of the vehicle, these errors become extremely large and may have a misleading effect on the vehicle systems such as ESP and restraint systems.

To avoid such malfunctions of the automotive systems, complex algorithms have been used in the past and the movement states in fallback planes producing the errors have been treated separately, e.g., in a separate steep curve detection. In other cases, spatial movement states are detected only poorly or not at all such as a vehicle rollover in the case of restraint systems, so that in such a state the airbags are frequently not deployed.

In the past more and more sensors have been installed in vehicles for detection of such situations. For example, it is already apparent with the ESP system that detection of such exceptional cases of movement states is complex.

SUMMARY OF THE INVENTION

It is an object of the present invention to permit a method and a system for detecting the spatial movement state of moving objects, e.g., vehicles, to make it possible to simplify the total effort for detecting exceptional situations; complex case differentiations and vehicle position estimates become superfluous and the algorithms of the individual systems may be simpler and less complex.

According to the present invention, a method of detecting a spatial movement state of moving objects, e.g., vehicles, is characterized in that at least three components of the spatial movement state are detected by sensors in at least three different spatial detection directions and are combined together to calculate resultants, at least one of the detection directions not being a cartesian coordinate.

According to the present invention, a system for detecting a spatial movement state of moving objects, e.g., vehicles, is characterized in that the system includes a sensor platform which is rigidly connected to the moving object, i.e., the vehicle, including at least three rotational rate sensors and/or acceleration sensors in a rigid alignment relative to one another, their detection directions differing, the detection direction of at least one of the acceleration sensors or rotational rate sensors not being a cartesian coordinate and signals being derivable from the sensors, each signal indicating a component of the spatial movement state in the detection direction, and also including a computing unit which is set up for combining the sensor signals it receives to calculate resultants of the signal components.

Thus, through a suitable arrangement of at least three sensors it is possible to calculate the spatial movement state. If at least one of these three sensors is not arranged as a cartesian coordinate relative to the other two sensors and is arranged so that the three sensing directions lie in a common plane, then it is possible to check the signals of the three sensors for plausibility.

If another sensor is added for redundancy reasons (e.g., four rotational rate sensors), then single errors in the sensor signals are detectable. If the error signal is much greater than the rotational rate actually applied, then it is possible in addition to ascertain which sensor is defective and how great the defect is. With five or more sensors, it is either possible to detect multiple errors or to detect errors in cases in which the error signal is of the same order of magnitude as the actual rotational rate.

In principle, algorithms for calculation of the spatial rotational rate are also suitable for calculation of the spatial translational movement because it is possible to represent both the accelerations and the rotational rates as vectors.

The spatial translational movement is detected according to exactly the same principles as those used to detect spatial rotational movements. Instead of rotational rate sensors, then the linear accelerations in the sensing directions are detected by using acceleration sensors. Thus, neither the configuration implementation nor the analytical algorithms for detection of the spatial translation differ from detection and analysis of the spatial rotational movement of moving objects.

It is possible to achieve the following advantages with the method according to the present invention and the system according to the present invention for detecting the spatial movement state of moving objects, e.g., vehicles:—central detection of the spatial movement state. In the past, the movement state has been detected and analyzed separately by each subsystem which has meant a great increase in equipment complexity;—saving on program code in vehicle systems because they are no longer performing the measurement signal processing and estimation separately but instead these are performed centrally at one location. This entails costs savings;—redundant information is made available to the automotive systems, as is required for safety-critical applications;—increased transparency because regulatory functions are separated from measured data processing and estimation of the driving state;—all automotive systems are based on the same movement state determined with the help of the method and/or system according to the present invention.

DETAILED DESCRIPTION

Figure 1:
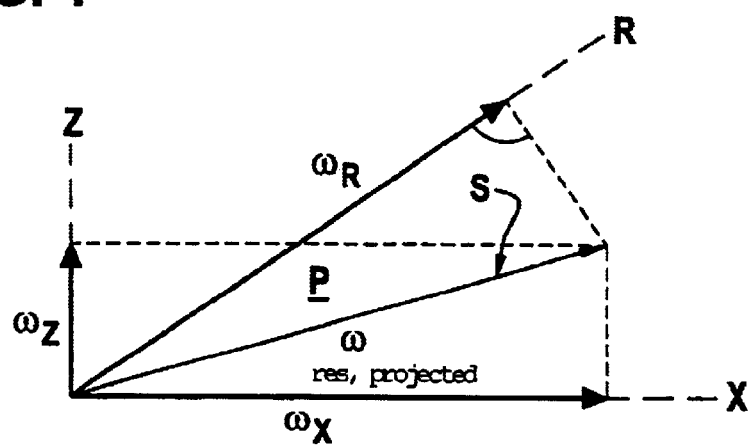
FIG. 1 shows a vector diagram to illustrate a first method according to the present invention, achieving partial detection of the movement state.

FIG. 1 shows a vector diagram to illustrate a first example embodiment of the method according to the present invention which permits partial detection of the spatial movement state.

Partial detection of the spatial movement state provides that redundant information may be generated even with a few sensors, e.g., three sensors here, if one is interested only in the movement component in the plane in which the sensors also do their detecting.

Vector $\omega_X$ illustrates a first rotational rate vector (angular velocity) which is the detection of the rate of rotation about the longitudinal axis of the vehicle (X axis) in the case of a motor vehicle, such as that detected for rollover applications. A second vector $\omega_Z$ perpendicular to first vector $\omega_X$ illustrates the detection of the rotation of a vehicle about the vertical axis (Z axis) using another rotational rate sensor. The detection directions of these two first rotational rate sensors are perpendicular to one another and are arranged in a plane P which is perpendicular to the vehicle platform. A third vector $\omega_R$ illustrates the detection of a movement component in a third direction which is not perpendicular to the first detection direction X or second detection direction Z, and is naturally also not parallel to directions X and Z. Vector $\omega_R$ is thus detected by a third rotational rate sensor whose detection direction is at an inclination to the detection directions of the two other sensors. However, all three detection directions X, Z, and R are in above-mentioned common plane P which is perpendicular to the vehicle platform in FIG. 1. An algorithm which analyzes the three vector components then ascertains whether the projection of the resulting rotational rate onto this plane P, which is illustrated by vector S, is equal for all combinations of sensor signals. If this is not the case, then there is an error.

The partial detection of the movement state illustrated on the basis of FIG. 1 is always appropriate when the vehicle systems are not interested in the complete movement state and consequently there is no demand for complete detection of the spatial movement state.

Figure 2:
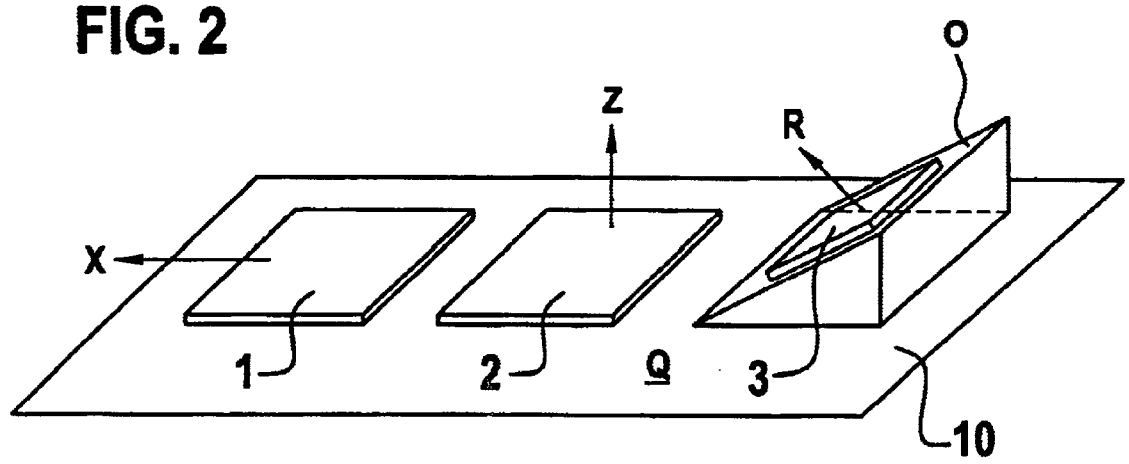
FIG. 2 shows schematically and in perspective a view of a first example embodiment of the system according to the present invention, implementing the principle illustrated in FIG. 1.

FIG. 2 shows an example embodiment of a system illustrating the method illustrated in FIG. 1 for partial detection of the spatial movement state. A first rotational rate sensor 1 for detecting component $\omega_X$ in direction X, which may be implemented as an out-of-plane detector, for example, and a second rotational rate sensor 2 for detecting component $\omega_Z$ in Z direction, which may be implemented as an in-plane detector, for example, are jointly arranged in a plane Q, which is defined by a sensor platform 10 and is arranged parallel to the plane defined by the vehicle platform (not shown).

An in-plane detector is understood to be a rotational rate sensor which executes at least approximately only a planar torsional vibration within the plane of the vibrating structure of the rotational rate sensor described in German Published Patent Application No. 195 00 800 (see, for example, FIG. 6 there), the axis of torsion or the rotational rate vector being oriented perpendicular thereto, while an out-of-plane detector is understood to be a rotational rate sensor which executes a torsional vibration out of the plane of the vibrating structure of the rotational rate sensor described in German Published Patent Application No. 195 00 800 A1 (see, for example, FIGS. 1 and 2 there), the axis of torsion or the rotational rate vector then lying in the plane of the vibrating structure.

Sensor platform 10 here may be, for example, the surface of a printed circuit board. A third rotational rate sensor 3 is, for example, an in-plane detector and lies in a plane O which is at an inclination to plane Q defined by sensor platform 10 so that its detection direction R is used to detect third movement component $\omega_R$. As mentioned above and illustrated in FIG. 1, all three sensing directions X, Z, and R lie in a common plane P, so it is possible to check the signals of three sensors 1, 2, and 3 for plausibility by mathematical projection of the resulting rotational rate onto this plane P.

Figure 3A:
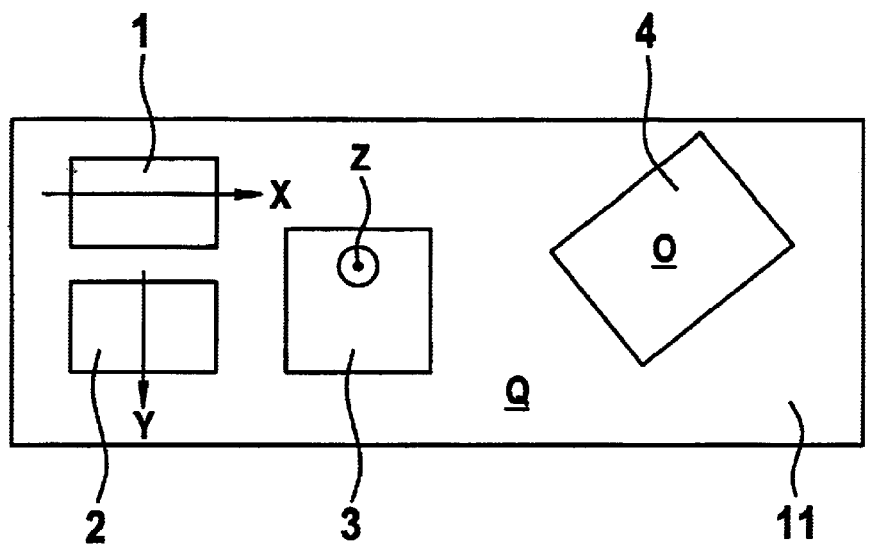
FIG. 3A shows a top view and perspective view of a second example embodiment of a system according to the present invention which includes four sensors for detecting the spatial movement state.
Figure 3B:
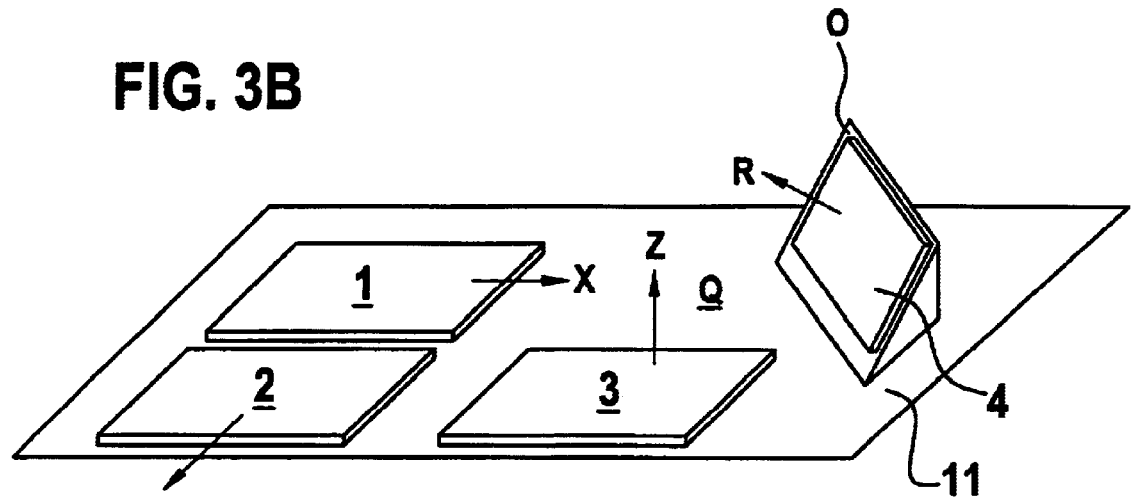
FIG. 3B shows a top view and perspective view of a second example embodiment of a system according to the present invention which includes four sensors for detecting the spatial movement state.

FIGS. 3A and 3B each show a top view and a perspective view, respectively, of a second example embodiment of a system according to the present invention. Three rotational rate sensors 1, 2, and 3 are mounted in cartesian coordinates in a plane defined by a sensor platform 11. Rotational rate sensors 1 and 2 may be implemented as out-of-plane detectors, for example, and rotational rate sensor 3 may be implemented as an in-plane detector, for example. The spatial rotational movement is calculable without redundancy from the signals derived from rotational rate sensors 1 to 3. A fourth rotational rate sensor 4 is mounted in a non-cartesian arrangement, i.e., at an inclination to each sensing direction X, Y, and Z of the first three rotational rate sensors, so its axis R of detection does not lie in the mounting plane of the other sensors nor is it perpendicular thereto. With the system illustrated in FIGS. 3A and 3B, the rotational movement may be calculated in four different manners. This information is thus available redundantly. Therefore, with the sensor system illustrated in FIGS. 3A and 3B, the four sensors 1, 2, 3, 4 are sufficient for establishing redundancy and detecting single errors. For the case when the error signal is large in comparison with the rotational rate actually applied, it is possible to locate the defective sensor and calculate the size of the error.

Figure 4:
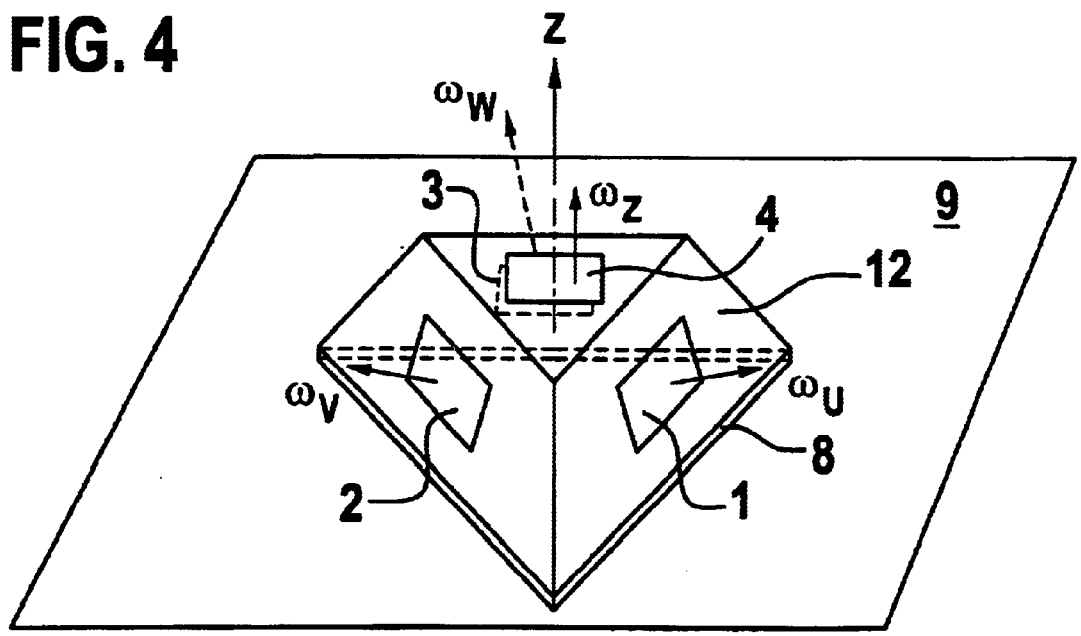
FIG. 4 shows schematically and in perspective a third example embodiment of the present invention including four sensors.

FIG. 4 shows a third example embodiment of a system according to the present invention whereby four rotational rate sensors are arranged in a non-cartesian alignment on a three-sided truncated pyramid which forms a sensor platform 12. Such a pyramidal arrangement is also called an affine arrangement. A first rotational rate sensor 1 for detection of a spatial movement component $\omega_U$ in direction U is arranged on a side face of the three-sided truncated pyramid, forming sensor platform 12; a second rotational rate sensor 2 for detection of a spatial movement component $\omega_V$ is arranged on a second side face of three-sided truncated pyramid 12, and a third rotational rate sensor 3 for detection of a movement component $\omega_W$ is arranged on a third side face of three-sided truncated pyramid 12. Furthermore, a fourth rotational rate sensor 4 is arranged on the top face of the three-sided truncated pyramid 12 for detection of a fourth movement component $\omega_Z$ in Z direction, which may be the vertical axis of the vehicle, for example. Fourth rotational rate sensor 4 may, of course, also be arranged on the underside of the three-sided truncated pyramid.

Since the above-mentioned out-of-plane detectors, e.g., micromechanical sensors of the type MM2* (*model designation of Robert Bosch GmbH) manufactured by the present applicant do not fulfill the desired specifications of the automotive systems for certain applications, only in-plane detectors, e.g., type MM3* (*model designation of Robert Bosch GmbH) are used for rotational rate sensors 1, 2, 3, 4 in the system shown in FIG. 4. Four sensors 1, 2, 3, 4 are arranged so that all possible combinations of three sensors are linearly independent. This arrangement makes it possible to influence the accuracy about the individual vehicle axes. Generally, detection of component $\omega_Z$ about vertical axis Z of the vehicle is needed with a greater accuracy than the accuracy required for detection of the rotations about the vehicle longitudinal and transverse axes, so a suitable system is especially sensitive in the direction of vertical axis Z. The pyramidal system shown in FIG. 4 whose central axis is aligned in the direction of vertical axis Z of the vehicle meets this requirement.

Due to the angle of inclination of the side faces of the truncated pyramid, it is possible to define the accuracy about vertical axis Z. The shallower the pyramid, the greater the accuracy about vertical axis Z. The increase in accuracy about vertical axis Z is of course obtained at the expense of the accuracy in detection of components $\omega_U$, $\omega_V$, and $\omega_W$, i.e., at the expense of the accuracy in detection of the movement components in the transverse and longitudinal axes of the vehicle.

With the system illustrated in FIG. 4, the orientation of the individual sensors 1, 2, 3, 4 is adaptable variably to the application. The truncated pyramid forming sensor platform 12 may be manufactured as an injection-molded plastic part, for example. Thus the shaping is very flexible and the angle errors may be minimized. In this case the orientation of the sensors relative to one another depends to a significant extent on the accuracy of the pyramid base body 12.

Individual sensor elements 1, 2, 3, 4 may be glued to base body 12, for example. To protect the sensors from high-frequency mechanical vibration, an intermediate layer 8 having a damping effect may be installed between truncated pyramid 12 and a printed circuit board 9. This intermediate layer 8 may be implemented by an elastic adhesive bond, for example.

Figure 5:
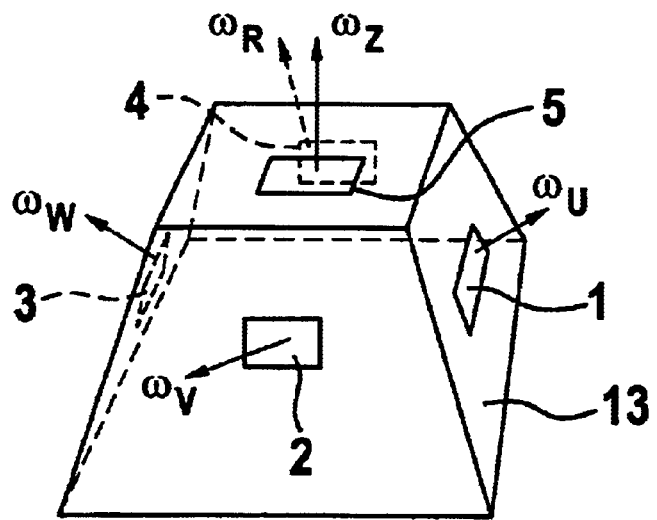
FIG. 5 shows schematically and in perspective a fourth example embodiment of the present invention.

FIG. 5 shows a non-cartesian system forming a fourth example embodiment of the present invention, including five sensors 1, 2, 3, 4, 5. Instead of three-sided truncated pyramid 12 of the third example embodiment (FIG. 4) this shows a four-sided truncated pyramid as sensor platform 13. Sensors 1, 2, 3, 4 are mounted on the four side faces of truncated pyramid 13 and a fifth sensor 5 is mounted on the top face thereof. The features mentioned above in conjunction with the example embodiment described on the basis of FIG. 4 also apply as a whole for the non-cartesian sensor system shown in FIG. 5.

In general, all geometries that are manufacturable such as regular polyhedrons, e.g., tetrahedrons, hexahedrons, octahedrons, dodecahedrons, icosahedrons, etc., are conceivable as the base body (sensor platform) for a non-cartesian sensor system. It should also be pointed out that the method according to the present invention may be implemented equally well if the sensors are not mounted on a one-piece base body as long as they are mounted rigidly to one another in the alignment. For the sake of thoroughness it should also be mentioned that the number of sensors is not limited to the systems described above using 3, 4, or 5 sensors, because the algorithms described below may also be generalized to n sensors, where n may denote an element of the natural numbers. With each additional sensor, the reliability of the error statement increases. However, in reality the cost of additional sensors limits the number of sensors.

Figure 6:
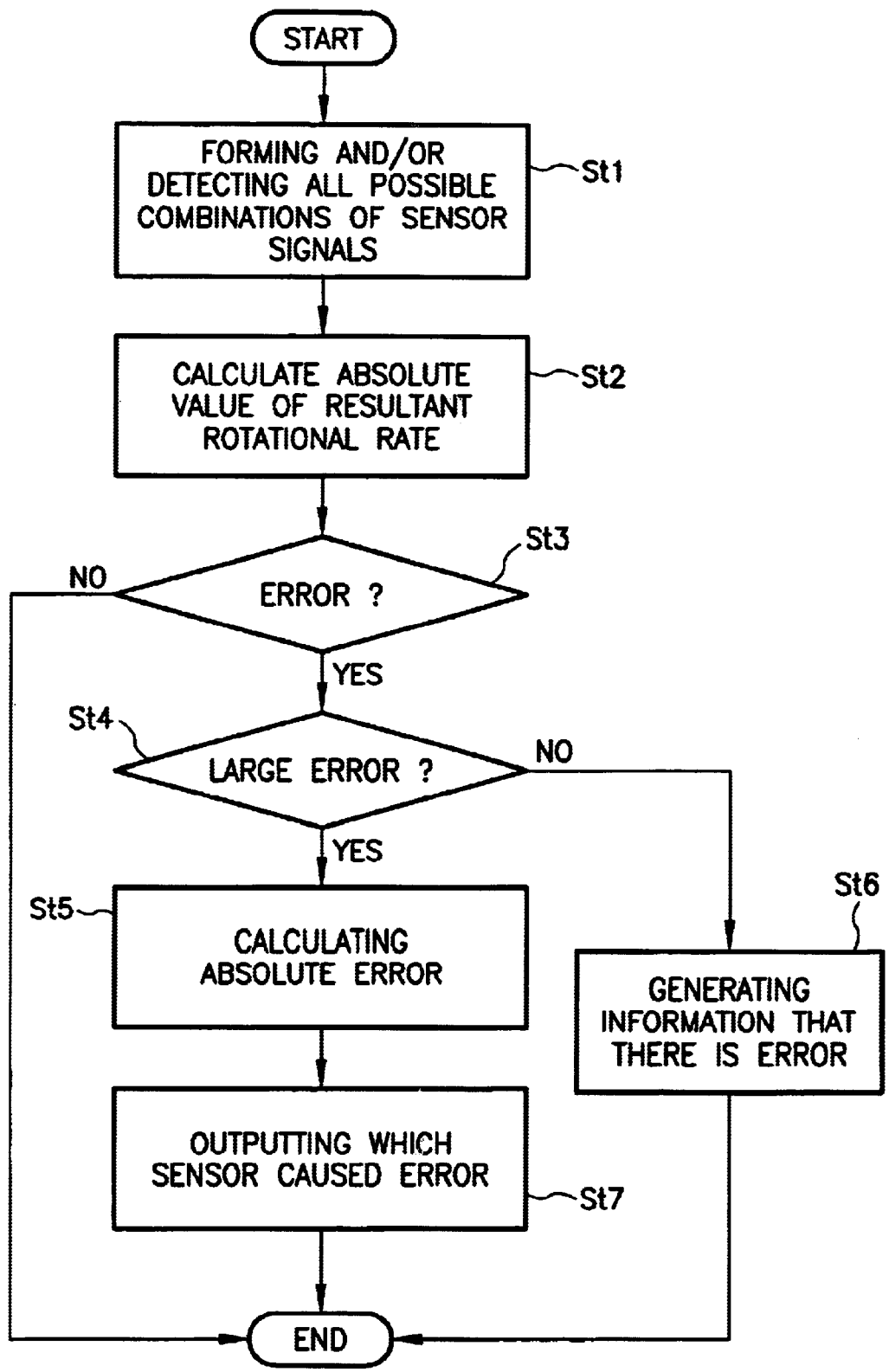
FIG. 6 shows a flowchart of an algorithm for detection of large single errors using an arrangement of four sensors in a tetrahedral pattern according to FIG. 4.

FIG. 6 shows in the form of a flow chart an algorithm for detection of large single errors with a sensor system including four sensors, e.g., the non-cartesian sensor system shown in FIG. 4. After the start of the program, first all possible combinations of sensor signals are formed and/or detected in a first step St 1. Then in a second step St 2, the absolute value of the resulting rotational rate is calculated for all these combinations. In a third step St 3, there is a query as to whether there is an error. An error is when at least one of the absolute values calculated in St 2 differs from the others. If there is no error, the program is terminated. If there is an error, then in a fourth step St 4 there is a query as to whether the error, represented by a signal F, is large. This question may be answered in the affirmative ("yes") if the error is much larger than the useful signal to be detected. An algorithm for detection of whether error signal F is large in comparison with the correct signal is described below. For this purpose, the absolute values are first sorted according to size. Let us assume that the largest absolute value is G1, the second largest absolute value is G2, the third largest absolute value is G3, and the smallest absolute value is K. The average of the three large absolute values is $G_{mean}$. If $G_{mean}-G1<\delta_1 \cap G_{mean}-G2<\delta_1 \cap G_{mean}-G3<\delta_1$ and $G_{mean}-K$ much greater than $\delta_2$, then it is possible to detect which sensor is defective, in which case the two limit values $\delta_1$ and $\delta_2$ are coordinated for the concrete application. Thus, if the result of a query in step St 4 is yes, then the defective sensor is identified in fifth step St 5.

Finally, after step St 5, the absolute error is calculated, outputting which sensor has caused the error in a last step St 7. Then the program is concluded. However, if the error is small in step St 4, the information will be generated in step St 6 that there is in fact an error but it is impossible to locate which sensor is defective and consequently the size of the error may not be calculated.

It is possible to detect that any combination of three of the four directional vectors, e.g., $\omega_U$, $\omega_V$, $\omega_W$, and $\omega_Z$ according to FIG. 4 is suitable for calculation of the spatial rotational movement;—there are four possible combinations of three;—both error states in which only one sensor supplies incorrect values (single errors) as well as those in which multiple sensors supply incorrect values simultaneously (multiple errors) are conceivable. The algorithms for this are more complicated;—there could also be errors caused by improper orientation of a sensor (e.g., due to improper mounting of the sensor or due to the fact that the sensor has become loose and has slipped within the housing).

The algorithm illustrated in FIG. 6 presupposes for error detection that the sensors are arranged geometrically almost correctly. Minor deviations may be compensated by calibration of the sensors. Accordingly, orientation errors of the sensors are ruled out. In addition, it is assumed in the algorithm of FIG. 6 that there are only single errors.

Using four sensors such as those provided in the noncartesian system in FIG. 4, for example, it is possible to detect which sensor is defective only in exceptional cases when the error signal is large. However, if the error signal is of the same order of magnitude as the actual rotational rate signal, it is impossible to locate the error using the algorithm described above and illustrated in FIG. 6.

However, using the sensor system containing five sensors 1, 2, 3, 4, 5 as illustrated in FIG. 5, it is possible to detect the defective sensor. In detection of all possible combinations, there are then ten possible three-way combinations instead of four.

Figure 7:
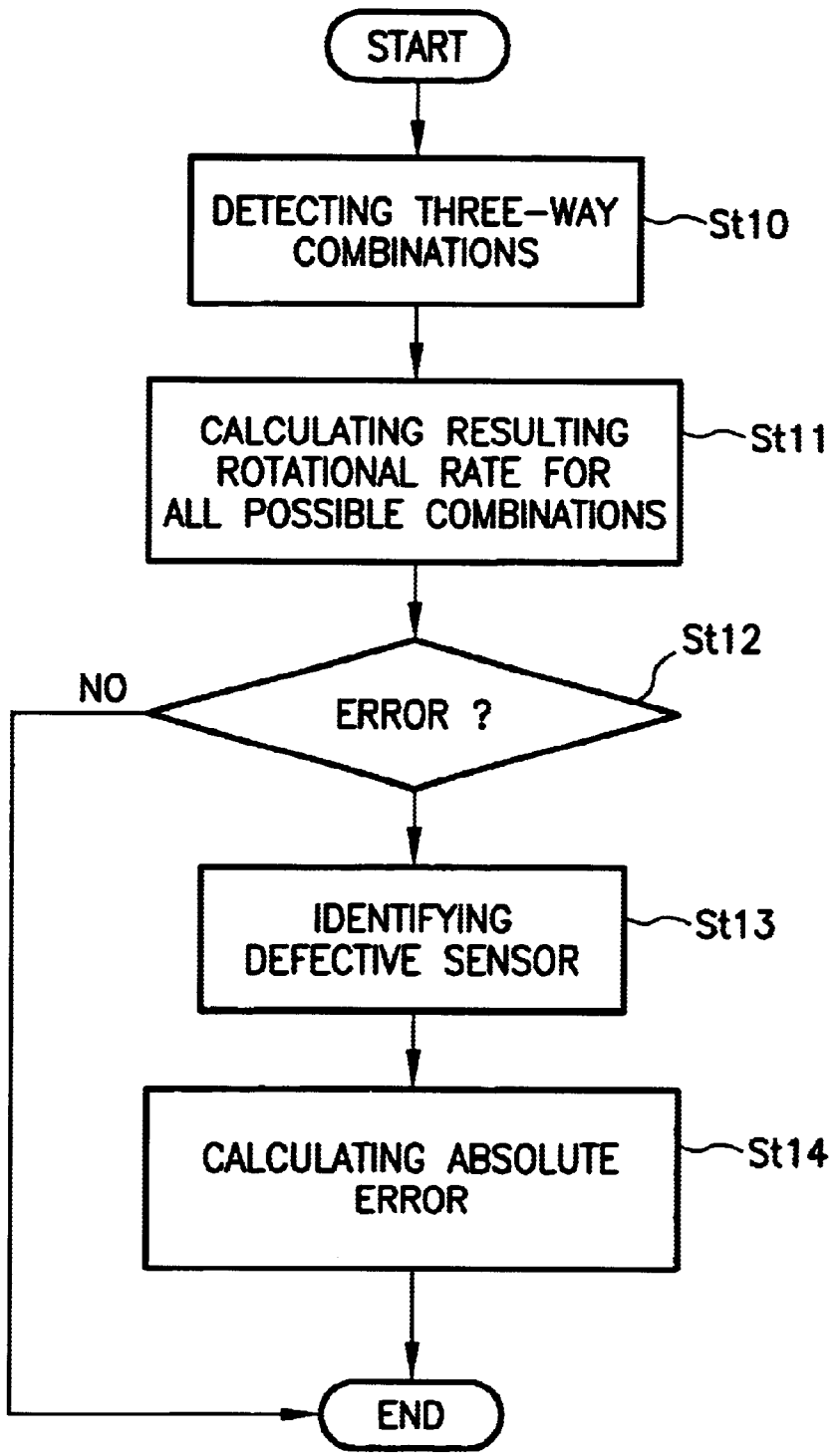
FIG. 7 shows a flow chart of an algorithm for detecting single errors using five sensors, e.g., in the system illustrated in FIG. 5.

With the algorithm illustrated in FIG. 7 in the form of a flow chart, it is possible by using five sensors, e.g., with the system shown in FIG. 5, to detect not only the errors but also which sensor has caused the error and to do so even if there is a small error signal, i.e., the resulting rotational rate signals which are subject to error differ only slightly from the correct resultant rotational rate signal. The algorithm described with the formula above for determining whether error signal F is large relative to the correct signal is also applicable here.

According to FIG. 7, in a first step St 10 all ten possible three-way combinations are detected. Then in a step St 11, the resulting rotational rate is calculated for all possible combinations. Then in a query step St 12 a distinction is made as to whether or not there is an error. If there is no error, the program is terminated. If there is an error, then in step St 13 the defective sensor is identified. Finally in the last step St 14 the absolute error is calculated, outputting which sensor has caused the error. If it is also possible for multiple errors to occur, then it is impossible to make a statement having general validity using the algorithms described so far, because in principle, error combinations in which the errors compensate one another so that they may not be discovered with these algorithms are also conceivable. The risk in the case of multiple errors which are not independent of one another is especially great if the sensors are mounted at a location where interference acts simultaneously on all sensors, e.g., a rock striking the bottom plate of the vehicle if the sensor platform is mounted on this bottom plate, or local electrical and/or magnetic disturbances in the vehicle. However, if the sensors are distributed throughout the vehicle, the risk of multiple errors decreases because the sensors are mounted at locations at a distance from one another, but then the equipment complexity increases because the sensor platforms are no longer as simple as those presented in the example embodiments of the present invention described above.

The detection of spatial translational movements occurs exactly according to the same principles as the detection of spatial rotational movements. Instead of the rotational rates, then linear accelerations in the sensing directions are detected by acceleration sensors. There are two fundamentally different micromechanical sensor types for this purpose: acceleration sensors with in-plane detection and acceleration sensors with out-of-plane detection. Thus neither the structural implementation nor the analytical algorithms differ from the systems and analytical algorithms described above for detection of the spatial rotational movement and the formation of redundancy.

For variants in which both the spatial rotational movement and spatial translational movement are to be detected, the following combinations are possible:—In one example embodiment, e.g., according to FIGS. 3A and 3B, an acceleration sensor and a rotational rate sensor are mounted side-by-side.—If in a pyramidal arrangement of sensors, e.g., according to the example embodiments in FIGS. 4 and 5, the truncated pyramid is large enough, a linear acceleration sensor may also be mounted next to each rotational rate sensor.—As an alternative, for measurement of the linear accelerations, a second truncated pyramid may also be mounted next to a first truncated pyramid for measurement of the rotational rates. Since rotational rate sensors measure the rotational rate indirectly by measuring the Coriolis acceleration, through a suitable internal wiring of the rotational rate sensors it would also be possible to measure the linear acceleration at the same time. This would eliminate a separate acceleration measurement instrument. Then the example embodiments described above, illustrated in FIGS. 3A, 3B, 4, and 5, could measure both the spatial rotational movement as well as the linear acceleration.

Figure 8:
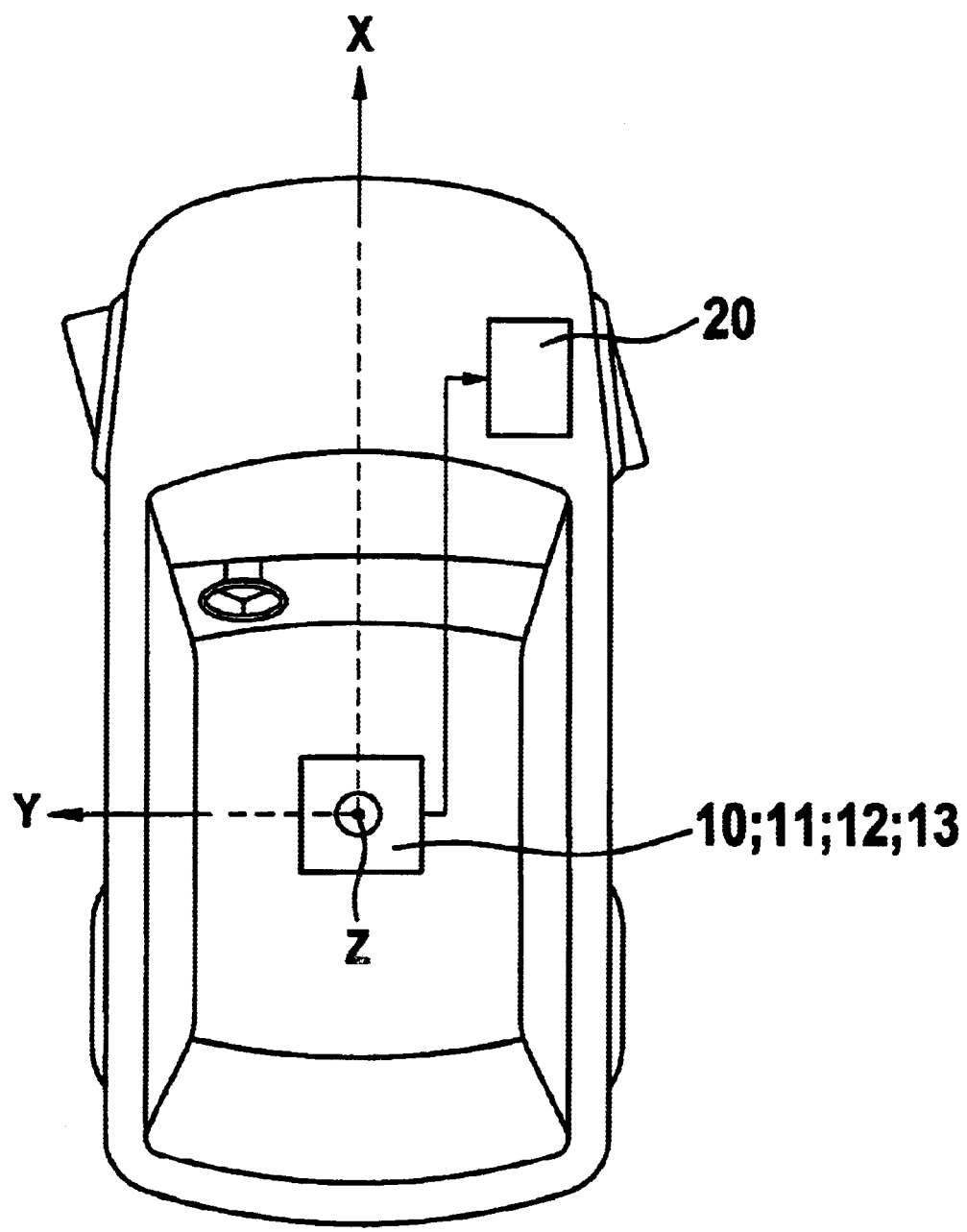
FIG. 8 shows schematically a block diagram of a system according to the present invention used in a motor vehicle.

FIG. 8 schematically shows a top view of a motor vehicle, which also shows vehicle longitudinal axis X, transverse axis Y, and vertical axis Z. A sensor platform 10, 11, 12, or 13 is mounted according to one of the example embodiments described above and illustrated in FIGS. 1 through 5. Sensor platform 10, 11, 12, or 13 supplies the individual sensor signals for a computing unit 20 mounted in the motor vehicle.

As an alternative, the individual sensor signals may also be combined by an electronic circuit on the sensor platform. Computing unit 20 may also be integrated with the sensor platform.

As mentioned above, the sensor platform need not necessarily be in one piece. The individual sensors may instead also be distributed throughout the vehicle and mounted in the corresponding orientation. However, the one-piece configuration of the sensor platform is simpler in terms of construction and equipment and is less expensive.

To implement one of the systems of a spatial movement state of moving objects as explained above, individual sensors may be attached to circuit boards, for example, and cabling using flexible connecting lines may also be provided. The comparatively accurate positioning required for this purpose of the sensors or circuit boards including the sensors is technically complex, however. The system may be constructed in the form of a multiaxial redundant sensor platform with the help of MID (molded interconnect devices). This is a circuit board concept which is produced by the injection-molding technique and metal plating technique. The injection-molding technique makes it possible to manufacture all types of geometries with high precision, e.g., with regard to the accuracy in positioning the sides of the base body. Then printed conductors which may extend over edges and corners may also be produced on the base body, e.g., a truncated pyramid, by a suitable metal plating technique such as 2-component injection molding or a hot embossing technique.

On the whole, the MID technique offers the possibility of producing 3D printed conductor structures with an especially high precision, so that very low tolerances are implementable in conjunction with component assemblers. Due to the metal plating technique used, the printed conductors are also integrated directly on the "sensor carrier" or base body, so that subsequent contacting via flexible printed conductors may be omitted.

Specifically, the sensor elements are first applied to an MID carrier by soldering, wire bonding, or flip-chip techniques, for example. This MID carrier is then placed on a "base" circuit board and joined to it by gluing, for example. MID technology at the same time offers the possibility of bundling all sensor contacts at one location on the MID carrier, e.g., on the underside of the carrier or in the area of an edge of the carrier. Finally, contacting of the MID carrier to the circuit board may be accomplished through a bonding technique, a plug connection integrated into the MID carrier or it may already be accomplished in gluing in that the contacts of the circuit board and the MID carrier are joined using an electrically conductive adhesive, which may be advantageous when the contacts are arranged on the underside of the carrier.

Figure 9:
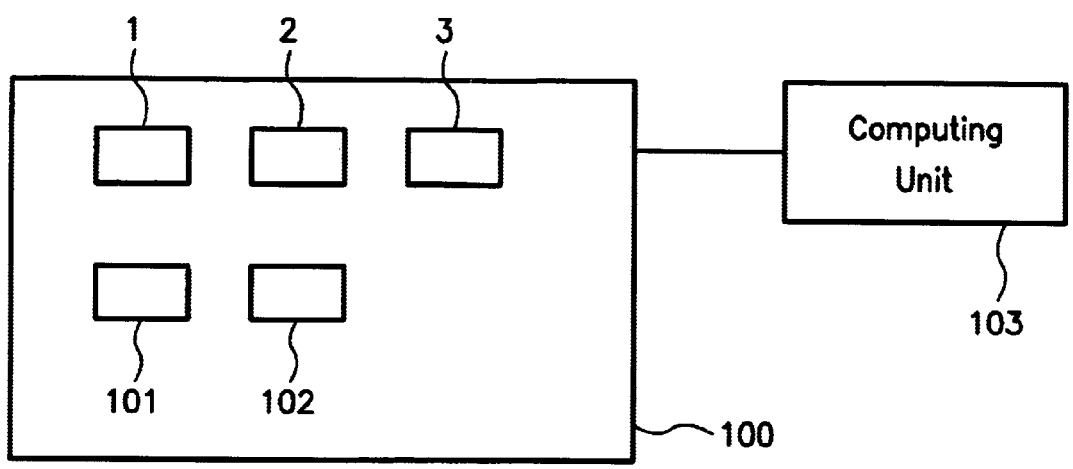
FIG. 9 shows schematically a block diagram of an example embodiment of a system according to the present invention.

FIG. 9 shows schematically a block diagram of an example embodiment of a system for detecting a spatial movement state of a moving object. The system shown in FIG. 9 includes a sensor platform 100 that is rigidly connected to the moving object and that includes (a) at least three rotational rate sensors 1, 2, 3 and/or (b) a plurality of acceleration sensors 101, 102 in a rigid alignment relative to one another, the at least three rotational rate sensors 1, 2, 3 and the plurality of acceleration sensors 101, 102 having different detection directions that are not a cartesian coordinate, a plurality of signals being derivable from the at least three rotational rate sensors 1, 2, 3 and the plurality of acceleration sensors 101,102, each signal of the plurality of signals indicating a component of the spatial movement state in a particular detection direction. The system also includes a computing unit 103 for combining the plurality of signals received thereby to calculate a plurality of resultants of the component of the spatial movement state indicated by one of the plurality of signals.

What is claimed is:

1. A method of detecting a spatial movement state of a moving object, comprising:
    detecting at least three components of the spatial movement state by manner of a plurality of sensors in at least three different spatial detection directions; and
    combining the at least three components together to calculate a plurality of resultants;
    wherein at least one of the at least three different spatial detection directions is not a cartesian coordinate in order to form a plurality of redundant sensor signals;
    wherein two movement components of the at least three components are detected in two mutually perpendicular cartesian detection directions, and a third movement component of the at least three components is detected in a third detection direction that is neither parallel nor perpendicular to a first detection direction and a second detection direction of the at least three different spatial detection directions, all of the at least three different spatial detection directions lying in a plane; and
    wherein the moving object is a vehicle and the two mutually perpendicular cartesian detection directions are each directed for detecting at least one of a rotational movement and a translational movement at least one of (a) about and (b) in a direction of a longitudinal axis of the vehicle, the two mutually perpendicular cartesian detection directions are each directed for detecting at least one of the rotational movement and the translational movement at least one of (a) about and (b) in a direction of a vertical axis of the vehicle, and one of a plausibility signal and an error signal in an event of an error is derived from one calculated projection of a resultant onto an indicated plane for all possible combinations of the at least three components detected.

2. The method of claim 1, wherein the at least three components include a rotational rate in one of the at least three different spatial detection directions.

3. A method of detecting a spatial movement state of a moving object, comprising:
    detecting at least three components of the spatial movement state by manner of a plurality of sensors in at least three different spatial detection directions; and
    combining the at least three components together to calculate a plurality of resultants;
    wherein at least one of the at least three different spatial detection directions is not a cartesian coordinate in order to form a plurality of redundant sensor signals;
    wherein the at least three movement components are detected in three mutually perpendicular cartesian detection directions and a fourth movement component is detected in a fourth detection direction that is neither parallel nor perpendicular to the at least three different spatial detection directions; and
    wherein the moving object is a vehicle and the three mutually perpendicular cartesian detection directions are each directed for detecting at least one of a rotational movement and a translational movement at least one of (a) about and (b) in a direction of a longitudinal axis of the vehicle, the three mutually perpendicular cartesian detection directions are each directed for detecting at least one of the rotational movement and the translational movement at least one of (a) about and (b) in a direction of a transverse axis of the vehicle, and the three mutually perpendicular cartesian detection directions are each directed for detecting at least one of the rotational movement and the translational movement at least one of (a) about and (b) in a direction of a vertical axis of the vehicle.

4. The method of claim 3, wherein the at least three components include a rotational rate in one of the at least three different spatial detection directions.

5. A method of detecting a spatial movement state of a moving object, comprising:
    detecting at least three components of the spatial movement state by manner of a plurality of sensors in at least three different spatial detection directions; and
    combining the at least three components together to calculate a plurality of resultants;
    wherein at least one of the at least three different spatial detection directions is not a cartesian coordinate in order to form a plurality of redundant sensor signals; and wherein a plurality of movement components is detected in n affine detection directions, n being an element of the natural numbers.

6. The method of claim 5, wherein at least one redundant spatial movement state is derived by calculating the plurality of resultants by using in each case different combinations of the at least three movement components that were detected, and one of a plausibility signal and an error signal, in case of an error, is determined for the plurality of sensors from the at least one redundant spatial movement state.

7. The method of claim 5, wherein the at least three components include a rotational rate in one of the at least three different spatial detection directions.

8. A system for detecting a spatial movement state of a moving object, comprising:
a sensor platform that is rigidly connected to the moving object and that includes at least one of at least three rotational rate sensors and a plurality of acceleration sensors in a rigid alignment relative to one another, the at least three rotational rate sensors and the plurality of acceleration sensors having different detection directions that are not a cartesian coordinate, a plurality of signals being derivable from the at least three rotational rate sensors and the plurality of acceleration sensors, each signal of the plurality of signals indicating a component of the spatial movement state in a particular detection direction; and
a computing unit for combining the plurality of signals received thereby to calculate a plurality of resultants of the component of the spatial movement state indicated by one of the plurality of signals.

9. The system of claim 8, wherein the moving object is a vehicle.

10. The system of claim 8, wherein a first sensor and second sensor of at least one of the at least three rotational rate sensors and the plurality of acceleration sensors are arranged on the sensor platform in a common first plane and are arranged so that a first detection direction of the first sensor and a second detection direction of the second sensor are perpendicular to one another, the second detection direction of the second sensor is perpendicular to the first plane, a third sensor of at least one of the at least three rotational rate sensors and the plurality of acceleration sensors is mounted on the sensor platform in a second plane which forms an angle differing from 0° and 90° to the first plane and has a third detection direction which is neither parallel nor perpendicular to the first detection direction and the second detection direction, and the first detection direction, the second detection direction, and the third detection direction lie in a common third plane.

11. The system of claim 10, wherein the sensor platform is mounted in a vehicle, the first sensor is an out-of-plane rotational rate detector and the second sensor is an in-plane rotational rate detector, the first sensor and the second sensor are each configured to detect a first rotational movement component about a longitudinal axis of the vehicle and a second rotational movement component about a vertical axis of the vehicle, the computing unit derives at least one of a plausibility signal and an error signal, in case of an error, from a projection of a calculated resultant onto the common third plane for all possible combinations of the at least three movement components thus detected.

12. The system of claim 8, wherein the sensor platform includes at least one of four rotational rate sensors and four acceleration sensors, a first sensor, a second sensor, and a third sensor of the sensor platform lie in a common first plane, the first sensor and the second sensor include a first detection direction and a second detection direction in a first plane, the first detection direction and the second detection direction are perpendicular to one another, the third sensor includes a third detection direction fixed on the first plane, and a fourth sensor is mounted on the sensor platform in a second plane at an inclination to the first plane so that a fourth detection direction of the fourth sensor is neither parallel nor perpendicular to the first detection direction, the second detection direction, nor the third detection directions.

13. The system of claim 12, wherein the sensor platform is mounted in a vehicle, the first sensor and the second sensor are each an out-of-plane rotational rate sensor, the third sensor is an in-plane rotational rate sensor, the first sensor detects a rotational movement about a longitudinal axis of the vehicle, the second sensor detects a rotational movement about a transverse axis of the vehicle, the third sensor detects a rotational movement about a vertical axis of the vehicle, and the computing unit calculates a rotational movement of the vehicle in space as a resultant of four different combinations of signal components from signal components received from the first sensor, the second sensor, the third sensor, and the fourth sensor and derives one of a plausibility signal and an error signal, in case of an error, from a comparison of the signal components.

14. The system of claim 8, wherein the sensor platform is configured in a form of a three-sided truncated pyramid and includes four sensors that are at least one of four rotational rate sensors and four acceleration sensors, each of the four sensors are mounted parallel to three side faces of the a three-sided truncated pyramid and parallel to one of a top face and a base face of the three-sided truncated pyramid, and detection directions of the four sensors are not cartesian coordinates so that all possible three-way combinations of the signal components derived from the four sensors are linearly independent of one another.

15. The system of claim 14, wherein the sensor platform is mounted in a vehicle, all of the four sensors are in-plane rotational rate sensors, and a center axis of the truncated pyramid is aligned in a direction of a vertical axis of the vehicle, so that the fourth sensor mounted parallel to one of the top face and the base face of the truncated pyramid detects a rotational movement of the vehicle about the vertical axis.

16. The system of claim 14, wherein an accuracy of the signal components detected by the four sensors is preselectable by selecting an angle of inclination of side faces of the three-sided truncated pyramid.

17. The system of claim 14, wherein for detection of a spatial rotational movement and a spatial translational movement, the sensor platform includes a first truncated pyramid on which the four rotational rate sensors are mounted and includes a second truncated pyramid on which the four acceleration sensors are mounted in a same manner as the four rotational rate sensors on the first truncated pyramid.

18. The system of claim 8, wherein the sensor platform is configured in a form of a four-sided truncated pyramid on which are mounted five sensors that are at least one of five rotational rate sensors and five acceleration sensors, the five sensors are each arranged parallel to four side faces of the four-sided truncated pyramid and parallel to one of a top face and a base face of the four-sided truncated pyramid, and detection directions of the four sensors are not cartesian coordinates, so that all possible three-way combinations of signal components derived from the five sensors are linearly independent.

19. The system of claim 18, wherein the sensor platform is mounted in a vehicle, the five sensors are in-plane rotational rate sensors and a center axis of the truncated pyramid is aligned in a direction of a vertical axis of the vehicle, so that a fifth sensor mounted parallel to one of the top face and the base face of the truncated pyramid detects a rotational movement of the vehicle about the vertical axis of the vehicle.

20. The system of claim 18, wherein an accuracy of signal components detected by the five sensors is preselectable by selecting an angle of inclination of side faces of the four-sided truncated pyramid.

21. The system of claim 8, wherein for exclusive detection of a spatial translational movement, the plurality of acceleration sensors detect linear accelerations in particular detection directions.

22. The system of claim 8, wherein for detection of a spatial rotational movement and a spatial translational movement, at least one of the acceleration sensors is mounted on the sensor platform in addition to each rotational rate sensor.

23. The system of claim 8, wherein for detecting a spatial rotational rate and a spatial translational movement, a plurality of universal sensors are mounted on a truncated pyramid, each of the plurality of universal sensors being able to measure an acceleration rate and a rotational rate simultaneously based on measurement principle thereof.

24. The system of claim 8, wherein the sensor platform includes a board-shaped substrate and at least one truncated pyramid manufactured as an injection-molded part on which at least one of the at least three rotational rate sensors and the plurality of acceleration sensors are fixedly mounted, the at least one truncated pyramid being fixedly joined to the board-shaped substrate.

25. The system of claim 24, wherein the board-shaped substrate is a printed circuit board, at least one of the at least three rotational rate sensors and the plurality of acceleration sensors being glued onto the truncated pyramid, the truncated pyramid is glued to the printed circuit board, and a plurality of electric contacts of at least one of the at least three rotational rate sensors and the plurality of acceleration sensors are joined to a plurality of printed conductors of the printed circuit board by a plurality of flexible connecting lines.

26. The system of claim 24, wherein the at least one truncated pyramid has a vibration damping due to a suitable mounting on the board-shaped substrate.

27. The system of claim 26, wherein the vibration damping is implemented by an adhesive bond between the at least one truncated pyramid and the board-shaped substrate.

* * * * *